United States Patent
Nehrke et al.

(10) Patent No.: US 12,405,325 B2
(45) Date of Patent: Sep. 2, 2025

(54) MR IMAGING WITH T1 COMPENSATED B1 MAPPING

(71) Applicant: KONINKLIJKE PHILIPS N.V., Eindhoven (NL)

(72) Inventors: Kay Nehrke, Ammersbek (DE); Peter Boernert, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 65 days.

(21) Appl. No.: 17/918,582

(22) PCT Filed: Apr. 20, 2021

(86) PCT No.: PCT/EP2021/060142
§ 371 (c)(1),
(2) Date: Oct. 13, 2022

(87) PCT Pub. No.: WO2021/214003
PCT Pub. Date: Oct. 28, 2021

(65) Prior Publication Data
US 2023/0145981 A1  May 11, 2023

(30) Foreign Application Priority Data
Apr. 23, 2020 (EP) .................... 20171014

(51) Int. Cl.
*G01R 33/24* (2006.01)
*G01R 33/50* (2006.01)
(Continued)

(52) U.S. Cl.
CPC .......... *G01R 33/246* (2013.01); *G01R 33/50* (2013.01); *G01R 33/5602* (2013.01); *G01R 33/5617* (2013.01)

(58) Field of Classification Search
CPC .. G01R 33/246; G01R 33/50; G01R 33/5602; G01R 33/5617; G01R 33/5615
See application file for complete search history.

(56) References Cited

U.S. PATENT DOCUMENTS 9,194,923 B2  11/2015  Yokosawa et al.
9,977,106 B2   5/2018  Nehrke et al.
(Continued)

FOREIGN PATENT DOCUMENTS

WO   WO-2018050777 A1 *  3/2018 ........... G01R 33/246

OTHER PUBLICATIONS

Walizai, Tariq "T1 weighted image" Radiopaedia <https://radiopaedia.org/articles/t1-weighted-image?lang=us> (Year: 2024).*
(Continued)

*Primary Examiner* — Rishi R Patel (57) ABSTRACT

The invention relates to a method of MR imaging. It is an object of the invention to provide an improved $B_1$ mapping method that is less affected by $T_1$ relaxation. The invention proposes that a first stimulated echo imaging sequence (25) is generated comprising at least two preparation RF pulses (α) radiated during a first preparation period (21) and a sequence of reading RF pulses (β) radiated during a first acquisition period (22) temporally subsequent to the first preparation period (21). A first set of FID signals ($I_{FID}$) and a first set of stimulated echo signals ($I_{STE}$) are acquired during the first acquisition period (22). A second stimulated echo imaging sequence (27) is generated comprising again at least two preparation RF pulses (α) radiated during a second preparation period (21) and a sequence of reading RF pulses (β) radiated during a second acquisition period (22) temporally subsequent to the second preparation period (21). A second set of FID signals ($I_{FID}$) and a second set of stimulated echo signals ($I_{STE}$) are acquired during the second acquisition period (22). The first and second sets of FID
(Continued)

signals (IFID) have different $T_1$-weightings and/or the first and second sets of stimulated echo signals ($I_{STE}$) have different $T_1$-weightings. A $B_1$ map indicating the spatial distribution of the RF field of the RF pulses is derived from the acquired first and second sets of FID ($I_{FID}$) and stimulated echo ($I_{STE}$) signals, wherein the different $T_1$-weightings are made use of to compensate for influences on the $B_1$ map caused by $T_1$ relaxation. Preferably, either the first or the second preparation period (21) is preceded by an RF inversion pulse to obtain the different $T_1$-weightings. Moreover, the invention relates to an MR device (1) and to a computer program for an MR device (1).

20 Claims, 3 Drawing Sheets (51) Int. Cl.
*G01R 33/56* (2006.01)
*G01R 33/561* (2006.01)

(56) References Cited

U.S. PATENT DOCUMENTS

| | | |
|---|---|---|
| 2005/0140369 A1 | 6/2005 | Feiweier et al. |
| 2010/0213938 A1* | 8/2010 | Jeong ............... G01R 33/5616 324/309 |
| 2010/0239142 A1* | 9/2010 | Dannels ............... G06T 11/003 324/309 |
| 2014/0218021 A1* | 8/2014 | Koehler ............... G01R 33/246 324/309 |
| 2014/0218022 A1 | 8/2014 | Koehler et al. |
| 2015/0002149 A1* | 1/2015 | Nehrke ............... G01R 33/246 324/309 |
| 2015/0042335 A1* | 2/2015 | Nehrke ............... A61B 5/0263 324/309 |

OTHER PUBLICATIONS

Nehrke et al "Dream—A Novel Approach for Robust Ultrafast Multislice B1 Mapping" Magn. Reson. Med. Vol. 86, p. 1517-1526 2012.
Hoon et al "Fast B1 Mapping Based On Interleave-Three Flip Angle Excitation" Medical Physics, vol. 40, No. 11 Oct. 10, 2013.
Nehrke et al "Volumetric B1 Mapping of the Brain At 7T Using Dream" Magnetic Reson. in Med. Feb. 14, 2013.
International Search Report and Written Opinion From PCT/EP2021/060142 Mailed Jul. 2, 2021.

* cited by examiner

MR IMAGING WITH T1 COMPENSATED B1 MAPPING

CROSS REFERENCE TO RELATED APPLICATIONS

This application is a U.S. national phase application of International Application No. PCT/EP2021/060142 filed on Apr. 20, 2021, which claims the benefit of EP Application Serial No. 20171014.2 filed on Apr. 23, 2020 and is incorporated herein by reference.

FIELD OF THE INVENTION

The invention relates to the field of magnetic resonance (MR) imaging. It concerns methods of MR imaging of at least a portion of an object. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local inhomogeneities of the main magnetic field) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

It is generally desirable to have a relatively uniform homogeneity of the generated transmit RF field ($B_1^+$ field, hereinafter referred to briefly as $B_1$) for excitation of magnetic resonance throughout a cross section and/or a volume of the imaged patient's body to maintain important MR contrast features. However, as the MR frequency increases, with increasing main magnetic field strength, this becomes more difficult due to conductive losses and wave propagation effects within the body of the patient. Consequently, an accurate measurement of the spatial distribution of the transmitted RF field is important for many MR imaging applications to support appropriate prospective (if applicable) and retrospective correction/compensation. This requires a robust and fast $B_1$ mapping technique. Especially at higher field strength, the acquisition speed of known $B_1$ mapping approaches is typically limited by SAR (Specific Absorption Ratio) constraints, $T_1$ relaxation times, or characteristic sequence properties. Thus, a multi-transmit $B_1$ calibration scan still represents a cumbersome procedure, because the measuring time scales with the number of transmit channels engaged, which increases the need for more efficient sampling schemes.

K. Nehrke and P. Börnert (Magn. Reson. Med., volume 86, issue 5, pages 1517-1526, 2012) have proposed a $B_1$ mapping approach referred to as "dubbed dual refocusing echo acquisition mode" (DREAM), which is able to cover the whole transmit coil volume in about one second, which is more than an order of magnitude faster than other existing fast $B_1$ mapping techniques like standard flip-angle imaging (AFI). The DREAM method employs a stimulated echo sequence including a preparation period with two preparation RF pulses followed by the generation of a single-shot low flip angle gradient echo train during an acquisition period temporally subsequent to the preparation period. Both the stimulated echo and the free induction decay (FID) are refocused in close temporal succession as gradient recalled echoes in a turbo field echo train (TFE)-like fashion, and their ratio is used to derive the actual flip angle of the stimulated echo preparation RF pulses.

The known DREAM approach ignores $T_1$ relaxation and, hence, represents an approximation. $T_1$ relaxation causes a recovery of the FID signal and a decay of the stimulated signal during the preparation period even if low-high k-space sampling is applied. Thus, $T_1$ relaxation leads to a systematic underestimation of the flip angle of the preparation RF pulses and consequently an underestimation of $B_1$. This applies in particular in cases of short $T_1$ and/or long echo trains during acquisition. Moreover, the error increases with increasing $B_1$ encoding flip angle, thereby reducing the accurate working range of the method. Furthermore, the $T_1$ recovery/decay during the echo train enhances/reduces the high spatial frequencies in the MR images reconstructed from the FID signals and the stimulated echo signals for deriving the $B_1$ map respectively, for low-to-high profile ordering, resulting in artefacts especially near the edges of the anatomy. To mitigate these problems, the echo train of the acquisition period has to be made as short as possible, which limits the resolution achievable in a single shot. Moreover, the maximum $B_1$ encoding flip angle has to be limited to about 60°, which constrains the dynamic range of the method.

SUMMARY OF THE INVENTION

From the foregoing it is readily appreciated that there is a need for an improved $B_1$ mapping method that is less affected by $T_1$ relaxation.

In accordance with the invention, a method of MR imaging of at least a portion of an object placed in the examination volume of an MR device is disclosed. The method comprises the steps of:

subjecting the portion of the object to a first stimulated echo imaging sequence comprising at least two preparation RF pulses radiated toward the portion of the object during a first preparation period and a sequence of reading RF pulses radiated toward the portion of the object during a first acquisition period temporally subsequent to the first preparation period;

acquiring a first set of FID signals and a first set of stimulated echo signals during the first acquisition period;

subjecting the portion of the object to a second stimulated echo imaging sequence comprising at least two preparation RF pulses radiated toward the portion of the object during a second preparation period and a sequence of reading RF pulses radiated toward the portion of the object during a second acquisition period temporally subsequent to the second preparation period;

acquiring a second set of FID signals and a second set of stimulated echo signals during the second acquisition period, wherein the first and second sets of FID signals have different $T_1$-weightings and/or the first and second sets of stimulated echo signals have different $T_1$-weightings;

deriving a $B_1$ map indicating the spatial distribution of the RF field of the RF pulses within the portion of the body from the acquired first and second sets of FID and stimulated echo signals, wherein the different $T_1$-weightings are made use of to compensate for influences on the $B_1$ map caused by $T_1$ relaxation.

It is the gist of the invention to apply two stimulated echo imaging sequences which are designed to impose different $T_1$-weightings onto the FID and stimulated echo signals acquired during the first and second acquisition periods respectively. The echo trains of the first and second acquisition periods preferably employ the same phase- and frequency encodings in order to provide identical k-space sampling. The different (and principally known) $T_1$-weightings can then be used in a straight-forward fashion to compensate for the influences that $T_1$ relaxation has on the resulting $B_1$ map. The $B_1$ map is acquired according to the invention by means of at least two instances of the known DREAM sequence. The method is still quick and maintains the high motion robustness of the DREAM approach.

In general, a stimulated echo sequence comprises three (for example 60° or 90°) RF pulses, wherein the first two RF pulses are preparation pulses. The first preparation RF pulse excites magnetic resonance and transforms the longitudinal nuclear magnetization into transverse nuclear magnetization. The second preparation RF pulse "stores" a fraction of the dephased transverse nuclear magnetization along the longitudinal axis. In case of 90° RF pulses this fraction is almost half of the dephased transverse magnetization. The third RF pulse is applied during the acquisition period which is temporally subsequent to the preparation period. The third RF pulse ("reading RF pulse") transforms the stored longitudinal nuclear magnetization into transverse nuclear magnetization again, thereby generating a so-called stimulated echo. Other RF refocused echoes are generated by this three RF pulse sequence, but those are not of interest here and may be suppressed by appropriate gradient switching regimes running in parallel to the RF irradiation. The stimulated echo signal together with the FID signal are acquired and used for $B_1$ mapping according to the invention.

The actual image generation on the basis of stimulated echoes is accelerated according to the invention by replacing the third RF pulse of the standard stimulated echo sequence by a train of low-flip angle reading RF pulses, wherein each reading RF pulse refocuses only a small portion of the nuclear magnetization. A plurality of FID signals and stimulated echo signals with appropriate phase and frequency encoding is acquired for generating a complete $B_1$ map. Efficient sampling schemes like EPI, spiral, parallel imaging or compressed sensing can be advantageously applied for this purpose in combination with the invention. The timing parameters of the imaging sequence can be adjusted such that susceptibility- and chemical shift-induced effects are essentially equal for both the FID and stimulated echo signals.

It should be mentioned that the at least two preparation RF pulses used to store $B_1$-encoded magnetization along the z-axis do not necessarily have to be of the same kind or flip angle.

In a preferred embodiment, the first and/or the second stimulated echo sequence is preceded by one or more pre-preparation RF pulses manipulating the longitudinal magnetization at the beginning of the first stimulated echo sequence to differ from the longitudinal magnetization at the beginning of the second stimulated echo sequence. Appropriate pre-preparation of the longitudinal magnetization, i.e. preparation of the longitudinal magnetization prior to the actual preparation period of the respective stimulated echo imaging sequence, achieves that the first and second sets of FID signals have different $T_1$-weightings and/or the first and second sets of stimulated echo signals have different $T_1$-weightings. This is the prerequisite for making use of the different $T_1$-weightings when deriving the $B_1$ map according to the invention.

In one possible variant, the first or the second preparation period is preceded by an RF inversion pulse. Hence, in this case, the pre-preparation RF pulse is an RF inversion pulse. By applying the RF inversion pulse before only one of the two stimulated echo sequences, while the other stimulated echo sequence is carried out without magnetization inversion, the desired different $T_1$-weightings of the first and second sets of FID and stimulated echo signals are obtained in a well-defined manner. In order to obtain an optimum inversion, an adiabatic RF inversion pulse may be employed. As known to an expert in the field, adiabatic RF pulses are amplitude and frequency modulated RF pulses that are insensitive to $B_1$-inhomogeneity and thus allow full spin inversion regardless of the usually present $B_1$ inhomogeneity.

In another variant, the one or more pre-preparation RF pulses are saturation RF pulses. The longitudinal magnetization is prepared in this case by radiating one or more saturation RF pulses to adjust the longitudinal magnetization to zero. By varying the delay between the saturation RF pulses and the beginning of the respective stimulated echo imaging sequence, a different longitudinal relaxation is enabled, so that the longitudinal magnetization at the beginning of the first stimulated echo sequence differs from the longitudinal magnetization at the beginning of the second stimulated echo sequence.

In another preferred embodiment, the portion of the object is subjected to the second stimulated echo imaging sequence with a delay after the first stimulated echo imaging sequence which delay is shorter than $T_1$. The short delay between the two stimulated echo imaging sequences prevents the longitudinal magnetization from full relaxation to equilibrium, thereby achieving that the longitudinal magnetization at the beginning of the first stimulated echo sequence differs from the longitudinal magnetization at the beginning of the second stimulated echo sequence.

In a further preferred embodiment, the step of deriving the $B_1$ map involves computing an FID difference image by subtracting MR images reconstructed from the FID signals of the first and second sets respectively as well as computing a stimulated echo difference image by subtracting MR images reconstructed from the stimulated echo signals of the first and second sets respectively, wherein the $B_1$ map is derived from the voxel-wise intensity ratio of the stimulated echo difference image and the FID difference image. It turns out that, for the case of applying magnetization inversion prior to one of the two stimulated echo sequences, $T_1$ relaxation effects, taking place during the read-out of the prepared magnetization, cancel out if the $B_1$ map is derived from the intensity ratio of the difference images. Hence, a $B_1$ map that is free from $T_1$ relaxation influences is obtained.

According to a further preferred embodiment of the invention, the at least two preparation RF pulses each have a flip angle of 45°-90°. In this way the amplitudes of the acquired stimulated echo signals are maximized which is advantageous in terms of signal-to-noise.

In yet a further preferred embodiment, two stimulated echo signals are acquired after each reading RF pulse during each of the first and second acquisition periods. These two stimulated echo signals can be a direct stimulated echo signal and a conjugate (also referred to as 'virtual') stimulated echo signal. The acquisition of the direct stimulated echo signal and the conjugate stimulated echo signal support a $T_2$-compensated acquisition scheme. In particular, the different $T_2$-weightings of the two stimulated echo signals can be made use of to compensate for influences on the $B_1$ map caused by $T_2$ relaxation. The two stimulated echo signals correspond to different coherence pathways generated by the stimulated echo sequence. For details, reference is made to WO 2013/105006 A1.

The method of the invention described thus far can be carried out by means of an MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention is preferably implemented by a corresponding programming of the reconstruction unit and/or the control unit of the MR device.

The methods of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
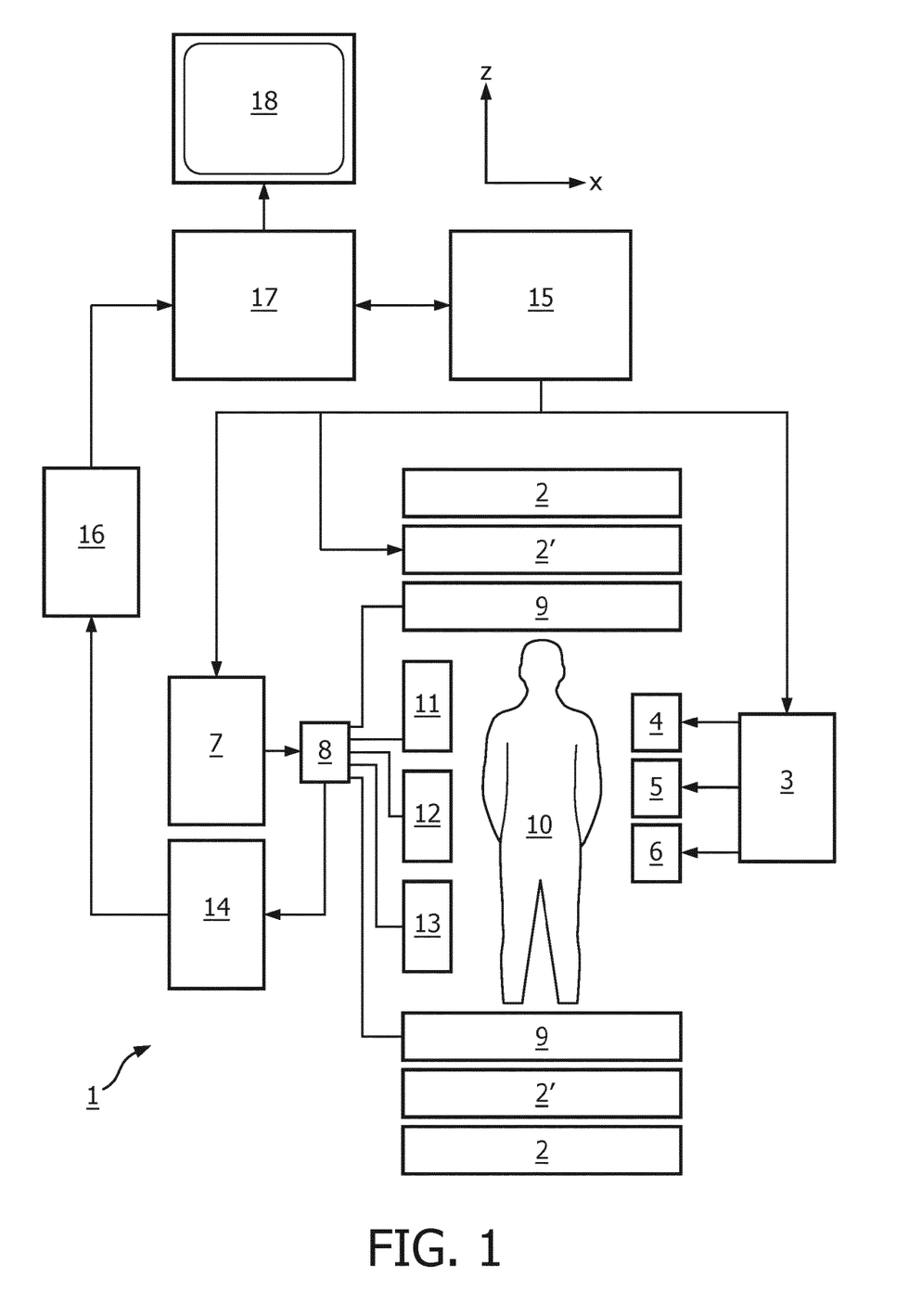
FIG. 1 schematically shows an MR device for carrying out the methods of the invention.

With reference to FIG. 1, an MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$ and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions. In parallel transmit applications, the array RF coils 11, 12, 13 may also be used for RF transmission, for example for the purpose of RF shimming. The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
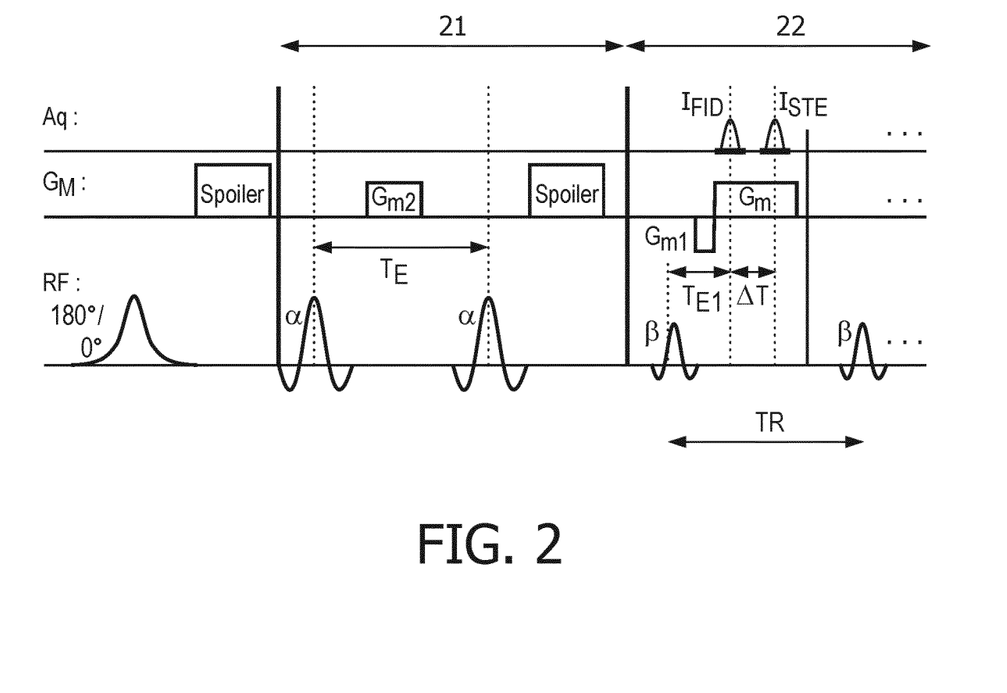
FIG. 2 shows a schematic diagram illustrating the imaging sequence according to the invention.

FIG. 2 shows a diagram illustrating an imaging sequence according to the invention. The depicted imaging sequence is a stimulated echo sequence which is subdivided into a preparation period 21 and an acquisition period 22. Two preparation RF pulses having a flip angle of α are applied during the preparation period 21. The two preparation RF pulses are separated by a time interval $T_E$. A de-phaser magnetic field gradient $G_{m2}$ is applied between the two preparation RF pulses. A sequence of reading RF pulses having flip-angle R are generated during the acquisition period 22, which is temporally subsequent to the preparation period 21. An FID signal $I_{FID}$ and a stimulated echo signal $I_{STE}$ are acquired after each reading pulse as gradient-recalled echoes in the presence of refocusing/readout magnetic field gradients $G_{m1}/G_m$. Spoiler gradients are applied to suppress undesired residual transverse magnetization. According to the invention, a phase-cycling scheme is implemented, wherein the depicted imaging sequence is played out twice, once with an adiabatic 180° RF inversion pulse preceding the preparation period 21, and once without preceding inversion of the longitudinal magnetization (indicated by 180°/0° in FIG. 2). For clarity, the employed slice-selection and phase-encoding magnetic field gradients are omitted in FIG. 2. The adiabatic 180° RF inversion pulse may be slice selective in the presence of a slice selection gradient (not depicted).

Without the RF inversion pulse and ignoring $T_1$ relaxation, the longitudinal magnetization directly after the preparation sequence 21, is given by $$M_{z,FID}=\cos^2(\alpha)\cdot M_0,$$

$$M_{z,STE}=\sin^2(\alpha)/2\cdot M_0,$$

wherein $M_{z,FID}$ and $M_{z,STE}$ denote the un-prepared (i.e. in-phase) and the stimulated echo-prepared (i.e. de-phased) longitudinal magnetization, respectively. Both the FID signal $I_{FID}$ generated from $M_{z,FID}$ and the stimulated echo signal $I_{STE}$ generated from $M_{z,STE}$ are acquired at different points in time $T_{E1}$ and $T_{E1}+\Delta T$, respectively. The delay $\Delta T$ between the two echoes $I_{FID}$, $I_{STE}$ is determined by the relation:

$$\Delta T = A_{mc2}/G_m,$$

wherein Amc2 denotes the gradient-time area of the de-phaser gradient Gm2 and Gm denotes the strength of the readout magnetic field gradient. Neglecting T1- and T2-effects, the two acquired echo signals IFID and ISTE are given by:

$$I_{FID}=\sin(\beta)\cdot\cos^2(\alpha)\cdot M_0,$$

$$I_{STE}=\sin(\beta)\cdot\sin^2(\alpha)/2\cdot M_0,$$

wherein β is the nominal flip angle of the reading RF pulses. Combining the above equations yields:

$$\alpha=\tan^{-1}(2I_{STE}/I_{FID})$$

Thus, the unknown flip angle α of the stimulated echo preparation RF pulses can be derived from the ratio of the acquired echo signals according to:

$$\alpha=\tan^-(2I_{STE}/I_{FID})$$

The above equations are an approximation because they do not consider $T_1$ relaxation. $T_1$ relaxation results in a recovery of the FID signal and a decay of the stimulated signal according to:

$$I_{FID}(k)=\sin(\beta)(E_1\cdot\cos^2(\alpha)+(1-E_1))\cdot M_0,$$

$$I_{STE}(k)=\sin(\beta)\cdot E_1\cdot\sin^2(\alpha)/2\cdot M_0,$$

with $E_1=e^{-(k\cdot TR+\Delta T)/T_1}$, wherein k and TR denote the index and the repetition time of the gradient echoes in the sequence of reading RF pulses, respectively, and $\Delta T$ is the time interval between the preparation period 21 and the first gradient echo. Thus, $E_1$ denotes the $T_1$ relaxation term responsible for the recovery of the FID signal and a decay of the stimulated echo signal. Thus, it is readily realized that $T_1$ relaxation will lead to a systematic underestimation of the flip angle α, especially for short $T_1$ and/or long echo trains. The error increases with increasing α thus reducing the accurate working range of the method.

The invention proposes to add a second instance of the stimulated echo imaging sequence with the adiabatic 180° RF inversion pulse being played out immediately before the preparation period 21. With the preceding inversion of the longitudinal magnetization, the acquired FID and stimulated echo signals are given by:

$$I_{FID,inv}(k)=\sin(\beta)(-E_1\cdot\cos^2(\alpha)+(1-E_1))\cdot M_0,$$

$$I_{STE,inv}(k)=-\sin(\beta)\cdot E_1\cdot\sin^2(\alpha)/2\cdot M_0.$$

Subtracting the inversion-prepared FID and stimulated echo MR images (reconstructed from the first set of FID and stimulated echo signals within the meaning of the invention) from the corresponding conventional, non-inversion-prepared MR images (reconstructed from the second set of FID and stimulated echo signals within the meaning of the invention) yields:

$$I_{FID,\Delta}(k)=I_{FID}(k)-I_{FID,inv}(k)=2\sin(\beta)\cdot E_1\cdot\cos^2(\alpha)\cdot M_0,$$

$$I_{STE,\Delta}(k)=I_{STE}(k)-I_{STE,inv}(k)=\sin(\beta)\cdot E_1\cdot\sin^2(\alpha)\cdot M_0.$$

Hence, the relaxation term $E_1$ cancels out, when the two equations are divided. The flip angle map (constituting the $B_1$ map) is then given by:

$$\alpha=\tan^{-1}(2I_{STE,\Delta}/I_{FID,\Delta}).$$

The equation for computing the flip angle thus remains the same, but the refined approach of the invention is entirely $T_1$-compensated.

One may suppose that the approach of the invention relies on proper magnetization inversion capabilities in one of the two instances of the stimulated echo sequence. It turns out, however, that this is not the case. The above equations can be formulated in a more general fashion under the assumption that the longitudinal magnetization at the beginning of the first stimulated echo sequence differs from the longitudinal magnetization at the beginning of the second stimulated echo sequence:

$$I_{FID}(k)=\sin(\beta)(E_1\cdot m_1\cdot\cos^2(\alpha)+(1-E_1))\cdot M_0,$$

$$I_{STE}(k)=\sin(\beta)\cdot E_1\cdot m_1\cdot\sin^2(\alpha)/2\cdot M_0,$$

$$I_{FID,inv}(k)=\sin(\beta)(E_1\cdot m_2\cdot\cos^2(\alpha)+(1-E_1))\cdot M_0,$$

$$I_{STE,inv}(k)=\sin(\beta)\cdot E_1\cdot m_2\cdot\sin^2(\alpha)/2\cdot M_0,$$

wherein $m_1$ and $m_2$ indicate the fractions of the longitudinal magnetization $M_0$ available at the beginning of first and second stimulated echo sequences respectively. Note that in case of perfect inversion $m_1=1$ and $m_2=-1$ applies in this special notation. Subtracting the differently longitudinal magnetization-prepared FID and stimulated echo MR images then yields:

$$I_{FID,\Delta}(k)=\sin(\beta)\cdot(m_1-m_2)\cdot E_1\cdot\cos^2(\alpha)\cdot M_0,$$

$$I_{STE,\Delta}(k)=\sin(\beta)\cdot(m_1-m_2)\cdot E_1\cdot\sin^2(\alpha)\cdot M_0/2.$$

The relaxation term $E_1$ and also the difference $(m_1-m_2)$ cancel out, when the two equations are divided. The flip angle map (constituting the $B_1$ map) is again given by:

$$\alpha=\tan^{-1}(2I_{STE,\Delta}/I_{FID,\Delta}).$$

It can thus be concluded that the approach of the invention for determining a $B_1$ map that is $T_1$-compensated does indeed not depend on a proper magnetization inversion. The only prerequisite for eliminating the $T_1$ influence is that the longitudinal magnetization at the beginning of the first stimulated echo sequence and the longitudinal magnetization at the beginning of the second stimulated echo sequence differ from each other.

However, as can be seen from the above formulas, the quality of the inversion has an influence on the signal-to-noise ratio in the resulting $B_1$ map. The difference signals $I_{FID,\Delta}(k)$ and $I_{STE,\Delta}(k)$ are maximum when the difference $(m_1-m_2)$ is maximum. This corresponds to the case of an optimum inversion. To this end, e.g., adiabatic secant RF pulses can be employed which can be significantly over-driven to flip angles of roughly 270° or 3600 degrees ensuring perfect magnetization inversion over the entire imaged volume.

Figure 2A:
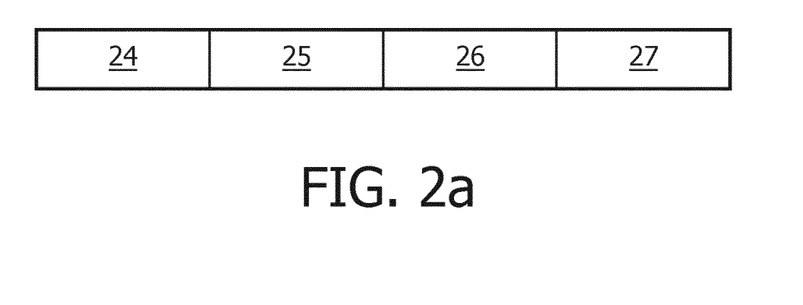
FIG. 2a schematically illustrates the succession of two stimulated echo imaging sequences in one variant of the invention.

In the embodiment of FIG. 2a, the first stimulated echo sequence 25 is preceded by a preparation module 24 and the second stimulated echo sequence 27 is preceded by a preparation module 26. RF pulses of the preparation modules 24, 26 manipulate the longitudinal magnetization at the beginning of the first stimulated echo sequence 25 to differ from the longitudinal magnetization at the beginning of the second stimulated echo sequence 27. This pre-preparation of the longitudinal magnetization, i.e. preparation of the longitudinal magnetization prior to the actual preparation period of the respective stimulated echo imaging sequences 25, 27, achieves that the first and second sets of FID signals and/or the first and second sets of stimulated echo signals have different $T_1$-weightings. According to the above formulas, this can be made use of for deriving a $T_1$-compensated $B_1$ map. The preparation modules 24, 26 may comprise saturation RF pulses to adjust the longitudinal magnetization to zero. By applying different delays in modules 24, 26 between the saturation RF pulses and the beginning of the respective stimulated echo imaging sequence 25, 27, longitudinal relaxation occurs to different extents so that the longitudinal magnetization ($m_1$) at the beginning of the first stimulated echo sequence 25 differs from the longitudinal magnetization ($m_2$) at the beginning of the second stimulated echo sequence 27.

Figure 2B:
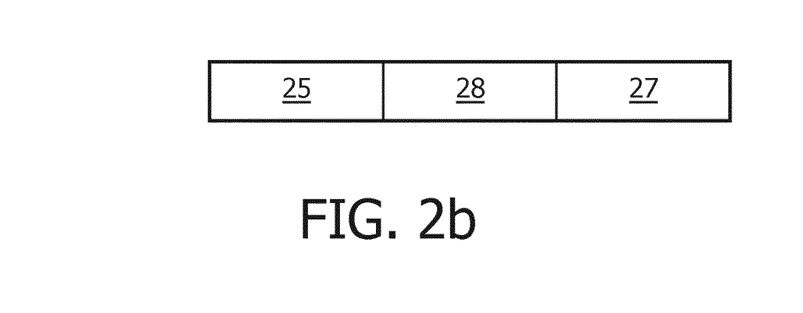
FIG. 2b schematically illustrates the succession of two stimulated echo imaging sequences in a further variant of the invention.

In the variant of FIG. 2b, the second stimulated echo imaging sequence 27 is simply applied with a delay 28 after the first stimulated echo imaging sequence 25. The delay 28 is shorter than $T_1$. The short delay between the two stimulated echo imaging sequences 25, 27 prevents the longitudinal magnetization from full relaxation to equilibrium, thereby achieving that the longitudinal magnetization ($m_1$) at the beginning of the first stimulated echo sequence 25 differs from the longitudinal magnetization ($m_2$) at the beginning of the second stimulated echo sequence 27.

Figure 3:
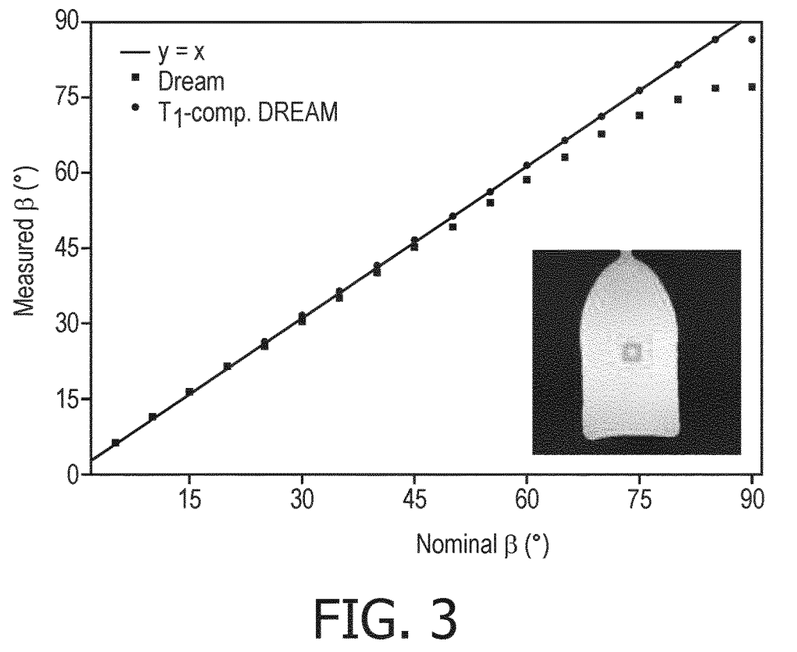
FIG. 3 demonstrates the accuracy of the $B_1$ mapping approach of the invention.

FIG. 3 illustrates an experimental application of the method of the invention. $B_1$-mapping was performed on a phantom (a bottle filled with mineral oil) in a 1.5 T MR imaging system. The proposed $T_1$-compensated stimulated echo sequence with adiabatic inversion pulse was employed (scan matrix=120×90, pixel size=2.5 mm, slice thickness=7 mm, TR=7.6 ms, echo train duration=660 ms). Two averages were performed with adiabatic RF pulses enabled and disabled, and imaging pulse phases of 0 and 180°, respectively. The phase cycling of the imaging RF pulses, and the averaging of the resulting MR images corresponds to a subtraction of the MR images according to the above equations. Alternatively, it would also be possible to toggle the receiver phase correspondingly. A delay of 3 s was used between the two stimulated echo imaging sequences to allow full $T_1$ recovery in the phantom.

Single-slice $T_1$-compensated $B_1$ maps where acquired for nominal flip angles α between 5 and 90 degrees in steps of 5 degrees. A 10×10 pixel region of interest in the centre of the phantom (depicted as square marking in FIG. 3) was used to average the stimulated echo and FID signals, and to derive the flip angle α according to the above equation. The derived flip angles are plotted against the nominal angles in the diagram of FIG. 3, which can be regarded as an accurate reference. The experiments and the analysis where repeated without preceding inversion RF pulse for comparison. The resulting data in the diagram show that the non-$T_1$-compensated $B_1$ map starts to degrade above a 50° flip angle. This is due to the short $T_1$ of the oil (about 100 ms) used in the phantom and the long acquisition duration of the high-resolution protocol, which was chosen on purpose. In contrast, the $T_1$-compensated $B_1$ maps are accurate up to 85°. Thus, the $T_1$-compensated method covers a much larger portion of the theoretical working range than the non-$T_1$-compensated method.

Figure 4:
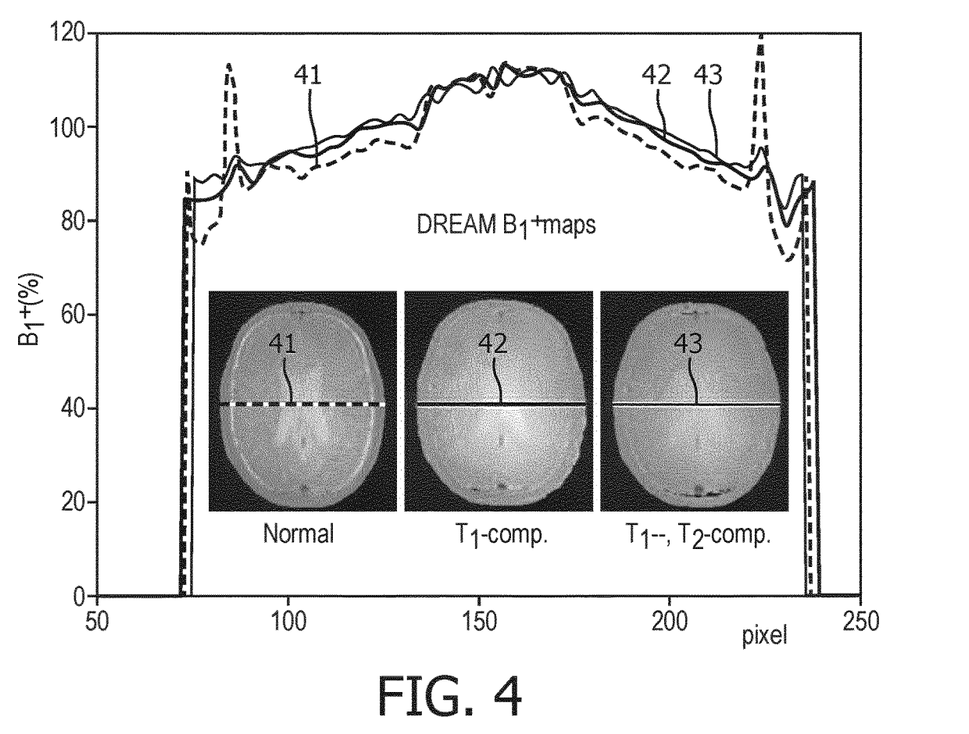
FIG. 4 illustrates $B_1$ mapping with and without $T_1$- and $T_2$-compensation according to the invention.

FIG. 4 shows an in-vivo (brain) application of the method of the invention in a 3 T MR imaging system. A transversal slice through the brain (intersecting the ventricle) was chosen and $B_1$ maps with and without $T_1$ compensation were acquired. In addition, also combined $T_1$- and $T_2$-compensation was applied by using also the conjugate stimulated echo. Without $T_1$ compensation (left slice image, designated "normal"), a strong $T_1$ contrast between ventricle, grey and white matter and the rim of the head is visible. In case of $T_1$ compensation (middle slice image, designated "$T_1$-comp."), the contrast between rim, grey and white matter disappears, and only slight contrast of the ventricle remains. This tiny remaining contrast disappears in case of both $T_1$ and $T_2$ compensation (right slice image, designated "$T_1$-, $T_2$-comp."), yielding a perfectly smooth $B_1$ map. The $B_1$ profile plots along the lines depicted in the slice images show that the $T_1$ weighting of non-$T_1$-compensated $B_1$ mapping (profile 41) results in an underestimation of $B_1$ by about 5% in grey and white matter. Profiles 42 and 43 deviate by less than 2%, while profile 42 (without $T_2$ compensation) still tends to underestimate $B_1$.

The example shown in FIG. 4 shows the improved robustness of the inversion prepared stimulated echo approach of the invention. This might also be beneficial to avoid mistakes of users when defining a suitable $B_1$ mapping protocol. Although the $T_1$ effect can be reduced, but not fully excluded by reducing the dual echo B-pulse train length (e.g. by scan segmentation or sacrificing spatial resolution), minimizing FID build up during the train, the inventors have seen many mistakes in user defined protocols that lead to significant anatomy shine through as shown in the left slice image of FIG. 43.

Modifications/extensions of the approach of the invention are conceivable. As shown, the use of the magnetization inversion allows to exclude the $T_1$ effects completely. However, those could potentially also be mitigated when $T_1$ would be known. For this purpose, after acquiring the first FID and stimulated echo data set a second data set can be acquired that starts with a different initial magnetization after the stimulated echo preparation. For the FID signals of both echo trains $T_1$ can be derived by a best fit method using as saturation recovery model. This $T_1$ information can then serve as an input to apply a $T_1$ compensation according to the above equations.

The invention claimed is:

1. A method of magnetic resonance (MR) imaging of at least a portion of an object placed in an examination volume of an MR device, the method comprising:
   subjecting the portion of the object to a first stimulated echo imaging sequence comprising at least two preparation RF pulses (α) radiated toward the portion of the object during a first preparation period and a sequence of reading RF pulses (β) radiated toward the portion of the object during a first acquisition period temporally subsequent to the first preparation period;
   acquiring a first set of FID signals ($I_{FID}$) and a first set of stimulated echo signals ($I_{STE}$) during the first acquisition period;
   subjecting the portion of the object to a second stimulated echo imaging sequence comprising at least two preparation RF pulses (α) radiated toward the portion of the object during a second preparation period and a sequence of reading RF pulses (β) radiated toward the portion of the object during a second acquisition period temporally subsequent to the second preparation period;
   acquiring a second set of FID signals ($I_{FID}$) and a second set of stimulated echo signals ($I_{STE}$) during the second acquisition period, wherein one of the first stimulated echo imaging sequence or the second stimulated echo imaging sequence is preceded by a pre-preparation RF pulse for manipulating a first longitudinal magnetization at a beginning of the first stimulated echo imaging sequence to differ from a second longitudinal magnetization at a beginning of the second stimulated echo imaging sequence; and
   deriving a B1 map indicating a spatial distribution of an RF field of the RF pulses within the portion of the object from the first and second sets of FID ($I_{FID}$) signals and the first and second sets of stimulated echo ($I_{STE}$) signals, wherein the pre-preparation RF pulse compensates for influences on the B1 map caused by $T_1$ relaxation.

2. The method of claim 1, wherein the pre-preparation RF pulse comprises an RF inversion pulse.

3. The method of claim 2, wherein the RF inversion pulse is an adiabatic RF inversion pulse.

4. The method of claim 1, wherein the pre-preparation RF pulse comprises a saturation RF pulse.

5. The method of claim 1, wherein the portion of the object is subjected to the second stimulated echo imaging sequence with a delay after the first stimulated echo imaging sequence, wherein the delay is shorter than $T_1$.

6. The method of claim 1, wherein deriving the B1 map involves computing a FID difference image by subtracting MR images reconstructed from the FID signals ($I_{FID}$) of the first and second sets respectively and computing a stimulated echo difference image by subtracting MR images reconstructed from the stimulated echo signals ($I_{STE}$) of the first and second sets respectively, wherein the B1 map is derived from a voxel-wise intensity ratio of the stimulated echo difference image and the FID difference image.

7. The method of claim 1, wherein the first and second sets of FID ($I_{FID}$) signals and the first and second sets of stimulated echo ($I_{STE}$) signals are acquired as gradient-recalled echo signals.

8. The method of claim 1, wherein two stimulated echo signals are acquired after each reading RF pulse (β) during each of the first and second acquisition periods.

9. The method of claim 8, wherein the two stimulated echo signals are a direct stimulated echo signal and a conjugate stimulated echo signal.

10. The method of claim 8, wherein different T2-weightings of the two stimulated echo signals are made use of to compensate for influences on the B1 map caused by T2 relaxation.

11. A magnetic resonance (MR) device comprising at least one main magnet coil for generating a uniform, steady magnetic field within an examination volume, a plurality of gradient coils for generating switched magnetic field gradients in different spatial directions within the examination volume, at least one RF coil for generating RF pulses within the examination volume and/or for receiving MR signals from an object positioned in the examination volume, a control unit for controlling a temporal succession of RF pulses and switched magnetic field gradients, and a reconstruction unit for reconstructing MR images from the received MR signals, wherein the MR device is arranged to perform a method including:

subjecting at least a portion of the object to a first stimulated echo imaging sequence comprising at least two preparation RF pulses (α) radiated toward the portion of the object during a first preparation period and a sequence of reading RF pulses (β) radiated toward the portion of the object during a first acquisition period temporally subsequent to the first preparation period;

acquiring a first set of FID signals ($I_{FID}$) and a first set of stimulated echo signals ($I_{STE}$) during the first acquisition period;

subjecting the portion of the object to a second stimulated echo imaging sequence comprising at least two preparation RF pulses (α) radiated toward the portion of the object during a second preparation period and a sequence of reading RF pulses (β) radiated toward the portion of the object during a second acquisition period temporally subsequent to the second preparation period;

acquiring a second set of FID signals ($I_{FID}$) and a second set of stimulated echo signals ($I_{STE}$) during the second acquisition period, wherein one of the first stimulated echo imaging sequence or the second stimulated echo imaging sequence is preceded by a pre-preparation RF pulse for manipulating a first longitudinal magnetization at a beginning of the first stimulated echo imaging sequence to differ from a second longitudinal magnetization at a beginning of the second stimulated echo imaging sequence; and deriving a B1 map indicating a spatial distribution of an RF field of the RF pulses within the portion of the object from the first and second sets of FID ($I_{FID}$) signals and the first and second sets of stimulated echo ($I_{STE}$) signals, wherein the pre-preparation RF pulse compensates for influences on the B1 map caused by $T_1$ relaxation.

12. The MR device of claim 11, wherein the pre-preparation RF pulse comprises an adiabatic RF inversion pulse.

13. The MR device of claim 11, wherein the pre-preparation RF pulse comprises a saturation RF pulses.

14. A non-transitory computer readable medium storing instructions that, when executed by a processor on a magnetic resonance (MR) device for imaging of at least a portion of an object, cause the processor to:

generate a first stimulated echo imaging sequence comprising at least two preparation RF pulses (α) radiated during a first preparation period and a sequence of reading RF pulses (β) radiated during a first acquisition period temporally subsequent to the first preparation period;

receive a first set of FID signals ($I_{FID}$) and a first set of stimulated echo signals ($I_{STE}$) during the first acquisition period;

generate a second stimulated echo imaging sequence comprising at least two preparation RF pulses (α) radiated during a second preparation period and a sequence of reading RF pulses (β) radiated during a second acquisition period temporally subsequent to the second preparation period;

receive a second set of FID signals ($I_{FID}$) and a second set of stimulated echo signals ($I_{STE}$) during the second acquisition period, wherein one of the first stimulated echo imaging sequence or the second stimulated echo imaging sequence is preceded by a pre-preparation RF pulse for manipulating a first longitudinal magnetization at a beginning of the first stimulated echo imaging sequence to differ from a second longitudinal magnetization at a beginning of the second stimulated echo imaging sequence; and derive a B1 map indicating a spatial distribution of an RF field of the RF pulses from the first and second sets of FID ($I_{FID}$) signals and the first and second sets of stimulated echo ($I_{STE}$) signals, wherein the pre-preparation RF pulse compensates for influences on the B1 map caused by $T_1$ relaxation.

15. The non-transitory computer readable medium of claim 14, wherein the pre-preparation RF pulse comprises an RF inversion pulse.

16. The non-transitory computer readable medium of claim 14, wherein the pre-preparation RF pulse comprises a saturation RF pulses.

17. The non-transitory computer readable medium of claim 14, wherein the portion of the object is subjected to the second stimulated echo imaging sequence with a delay after the first stimulated echo imaging sequence, wherein the delay is shorter than $T_1$.

18. The non-transitory computer readable medium of claim 14, wherein the instructions cause the processor to derive the B1 map by computing a FID difference image by subtracting MR images reconstructed from the FID signals ($I_{FID}$) of the first and second sets respectively and computing a stimulated echo difference image by subtracting MR images reconstructed from the stimulated echo signals ($I_{STE}$) of the first and second sets respectively, wherein the B1 map is derived from a voxel-wise intensity ratio of the stimulated echo difference image and the FID difference image.

19. The non-transitory computer readable medium of claim 14, wherein the first and second sets of FID ($I_{FID}$) signals and the first and second sets of stimulated echo ($I_{STE}$) signals are gradient-recalled echo signals.

20. The non-transitory computer readable medium of claim 14, wherein two stimulated echo signals are acquired after each reading RF pulse (β) during each of the first and second acquisition periods.

* * * * *